United States Patent
Lu et al.

(10) Patent No.: US 7,599,228 B1
(45) Date of Patent: Oct. 6, 2009

(54) FLASH MEMORY DEVICE HAVING INCREASED OVER-ERASE CORRECTION EFFICIENCY AND ROBUSTNESS AGAINST DEVICE VARIATIONS

(75) Inventors: Qiang Lu, San Mateo, CA (US); Kuo-Tung Chang, Saratoga, CA (US); Kazuhiro Mizutani, Sunnyvale, CA (US); Sung-Chul Lee, Cupertino, CA (US); Sheung-Hee Park, Pleasanton, CA (US); Ming-Sang Kwan, San Leandro, CA (US)

(73) Assignee: Spansion L.L.C., Sunnyvale, CA (US)

( * ) Notice: Subject to any disclaimer, the term of this patent is extended or adjusted under 35 U.S.C. 154(b) by 0 days.

(21) Appl. No.: 10/976,760

(22) Filed: Nov. 1, 2004

(51) Int. Cl.
*G11C 16/04* (2006.01)
(52) U.S. Cl. .................... 365/185.3; 365/28
(58) Field of Classification Search .............. 365/185.3, 365/185.29, 185.28
See application file for complete search history.

(56) References Cited

U.S. PATENT DOCUMENTS

| | | | | |
|---|---|---|---|---|
| 4,495,513 A * | 1/1985 | Descamps | .................... | 257/144 |
| 5,220,528 A * | 6/1993 | Mielke | ..................... | 365/185.3 |
| 5,526,315 A * | 6/1996 | Kaya et al. | ............. | 365/185.18 |
| 5,642,311 A | 6/1997 | Cleveland et al. | ......... | 365/185.3 |
| 5,869,873 A * | 2/1999 | Yu | .............................. | 257/362 |
| 5,901,090 A | 5/1999 | Haddad et al. | ......... | 365/185.29 |
| 5,930,173 A * | 7/1999 | Sekiguchi | .............. | 365/185.22 |
| 6,055,143 A * | 4/2000 | Yu | .............................. | 361/56 |
| 6,252,803 B1 | 6/2001 | Fastow et al. | .......... | 365/185.22 |
| 6,452,840 B1 | 9/2002 | Sunkavalli et al. | ....... | 365/185.3 |
| 6,469,939 B1 * | 10/2002 | Wang et al. | ............ | 365/185.28 |
| 6,765,827 B1 * | 7/2004 | Li et al. | .................. | 365/185.09 |
| 2006/0018070 A1 * | 1/2006 | Iben | .......................... | 361/91.1 |

* cited by examiner

*Primary Examiner*—Huan Hoang
*Assistant Examiner*—Anthan T Tran
(74) *Attorney, Agent, or Firm*—Harrity & Harrity, LLP

(57) ABSTRACT

A memory device is provided including circuitry for correcting an over-erased memory cell in the memory device. The memory device may include a substrate. A control gate and a floating gate may be formed over the substrate. The memory device may include a source region and a drain region. A first resistive element may be coupled between the source region and the control gate.

18 Claims, 5 Drawing Sheets

FLASH MEMORY DEVICE HAVING INCREASED OVER-ERASE CORRECTION EFFICIENCY AND ROBUSTNESS AGAINST DEVICE VARIATIONS

TECHNICAL FIELD

The present invention relates generally to memory devices. The present invention has particular applicability to non-volatile flash memory cells in electrically erasable and programmable memory devices.

BACKGROUND ART

A flash or block erase Electrically Erasable Programmable Read-Only Memory (Flash EEPROM) device includes an array of cells that can be independently programmed and read. The size of each cell and thereby the memory device are made small by omitting transistors known as select transistors that enable the cells to be erased independently. As a result, a group of the cells must be erased together as a block.

A flash memory device of this type includes individual Metal-Oxide-Semiconductor Field Effect Transistor (MOSFET) memory cells, each of which includes a source, a drain, a floating gate and a control gate to which various voltages are applied to thereby program the cell with a binary 1 or 0, to erase all or some of the cells as a block, to read the cell, to verify that the cell is erased or to verify that the cell is not over-erased.

Memory cells in a flash memory device are typically connected in an array of rows and columns, with the control gates of the cells in a row being connected to a respective word line and the drains of the cells in a column being connected to a respective bit line. The sources of all the cells may be connected together.

A cell is typically programmed by applying a voltage to the control gate, applying a voltage to the drain and grounding the source. A cell is typically read by applying a voltage to the word line to which the control gate of the cell is connected, applying a voltage to the bit line to which the drain of the cell is connected, grounding the source, and sensing the bit line current. If the cell is programmed and the threshold voltage is relatively high, the bit line current will be zero or nearly zero. If the cell is not programmed or erased, the threshold voltage will be relatively low, the control gate voltage will enhance the channel, and the bit line current will be relatively high.

A cell can be erased in several ways. In one arrangement, a cell may be erased by applying a relatively high voltage to the source, grounding the control gate and allowing the drain to float. These applied voltages cause the electrons that were injected into the floating gate during programming to undergo Fowler-Nordheim tunneling from the floating gate through the thin tunnel oxide layer to the source. In another arrangement, applying a negative voltage to the control gate, applying a voltage to the source and allowing the drain to float also erases a cell. A further method of erasing a cell is accomplished by applying a voltage to the P-well (substrate) and a negative voltage to the control gate, while allowing the source/drain to float.

A problem with the conventional flash EEPROM cell arrangement is that due to manufacturing tolerances, some cells become over-erased before other cells are sufficiently erased. The floating gates of the over-erased cells are depleted of electrons and become positively charged. The over-erased cells then effectively function as depletion mode transistors that cannot be turned off by applying normal operating voltages to their control gates. The cells functioning as depletion mode transistors also introduce leakage current during subsequent program and read operations.

More specifically, during program and read operations only one word line connected to the control gates of a row of cells is held high at a time, while the other word lines are grounded. A positive voltage is applied to the drains of all of the cells and if the threshold voltage of an unselected cell is zero or negative, the leakage current will flow through the source, channel and drain of the cell.

The undesirable effect of the leakage current from the over-erased cells is as follows. In a typical flash EEPROM, the drains of a large number of memory transistor cells, for example 512 transistor cells are connected to each bit line. If a substantial number of cells on the bit line are drawing background leakage current, the total leakage current on the bit line can exceed the cell read current. This makes it impossible to read the state of any cell on the bit line and therefore renders the memory inoperative.

Because the background leakage current of a cell varies as a function of threshold voltage, the lower (more negative) the threshold voltage the higher the leakage current. It is therefore desirable to prevent cells from being over-erased by reducing the threshold voltage distribution to as low a range as possible, with ideally all cells having the same threshold voltage after erase.

It is known in the art to reduce the threshold voltage distribution by performing an over-erase correction operation, which reprograms the most over-erased cells to a higher threshold voltage. An over-erase correction operation of this type is generally known as Automatic Programming Disturb after Erase (APDE).

One APDE method includes sensing for over-erased cells and applying programming pulses thereto, which bring their threshold voltages back to acceptable values. Following application of an erase pulse, under-erase correction may be performed on a cell-by-cell basis by row. The cell in the first row and column position may be addressed and erase verified by applying a voltage to the control gate (word line), a voltage to the drain (bit line), grounding the source, and using sense amplifiers to sense the bit line current to determine if the threshold voltage of the cell is above a value of, for example, 2 volts. If the cell is under-erased, indicated by a threshold voltage above 2 volts, the bit line current will be low. In this case, an erase pulse (e.g., a bias voltage) is applied to all of the cells, and the first cell is erase verified again.

After application of each erase pulse and prior to a subsequent erase verify operation, over-erase correction may be performed on all the cells in the memory. Over-erase verification may be performed on the bit lines of the array or memory in sequence by grounding the word lines, applying a voltage to each bit line in sequence and sensing the bit line current. If the bit line current is above a predetermined value, at least one of the cells connected to the bit line is over-erased and is drawing leakage current. In this case, an over-erase correction pulse is applied to the bit line. The over-erase correction pulse may be applied to the bit line for a predetermined length of time, typically 100 μs.

After application of the over-erase correction pulse to the bit line, the cells on the bit line are over-erase verified again. If the bit line current is still high indicating that an over-erased cell still remains connected to the bit line, another over-erase correction pulse is applied to the bit line. This procedure is repeated, as many times as necessary until the bit line current is reduced to the predetermined value that is lower than the read current. Then, the procedure is performed for the rest of the cells in the first row and following rows until all of the cells in the memory have been erase verified.

By performing the over-erase correction procedure after each erase pulse, the extent to which cells are over-erased is reduced, improving the endurance of cells. Further, because over-erased cells are corrected after each erase pulse, bit line leakage current is reduced during erase verify, thus eliminating under-erased cells upon completion of the erase verify procedure.

Over-erase correction pulses, as described above, may be applied to each column of connected memory cells for a predetermined time period to inject a particular amount of charge carriers, such as electrons, into the floating gate structure of each flash memory cell to raise the threshold voltage of each flash memory cell. The longer the time period for applying such a pulse, the higher the increase in the threshold voltage of each flash memory cell. The higher the threshold voltage of each flash memory cell, the lower the leakage current through each flash memory cell. Such a time period for applying the pulse for the APDE process may be referred to as the "APD" time.

Unfortunately, it has been found that the length of the APD time period for each of the flash memory cells attaining the desired threshold voltage is affected by the leakage current of the other commonly connected flash memory cells. When this leakage current flows through resistors coupled at the drain of the flash memory cells, the resulting voltage across the drain and source terminals of the flash memory cells is lowered. Such lowered voltage across the drain and source terminals decreases the rate of charge carrier injection into the floating gate structure of the flash memory cells for a less efficient APDE process.

The level of leakage current is especially acute for flash memory cells having scaled down dimensions of hundreds of nanometers for the channel length because of DIBL (Drain Induced Barrier Lowering). For example, when the channel length of each flash memory cell is less than about 0.22 µm, the DIBL voltage change at the drain of a flash memory may be greater than about 0.6 Volts. Despite higher leakage current with a smaller flash memory cell, the dimensions of the flash memory cell are desired to be scaled down further for enhanced speed performance and smaller occupied area.

Applying the over-erase correction pulses of the APDE process for a longer period of time (i.e., a higher APD time) ensures a higher average threshold voltage for the column of flash memory cells to minimize leakage current. A predetermined APD time is used for each cycle in the APDE process such that an acceptably low level of leakage current flows through the column of flash memory cells. However, a higher APD time disadvantageously slows down the erasing cycle of the flash memory array.

DISCLOSURE OF THE INVENTION

Advantages and other features of the invention will be set forth in part in the description which follows and in part will become apparent to those having ordinary skill in the art upon examination of the following or may be learned from the practice of the invention. The advantages and features of the invention may be realized and obtained as particularly pointed out in the appended claims.

According to one implementation consistent with principles of the invention, a memory device is provided including circuitry for correcting an over-erased memory cell in the memory device. The memory device may include a substrate. A control gate and a floating gate may be formed over the substrate. The memory device may include a source region and a drain region. A first resistive element may be coupled between the source region and the control gate.

According to another aspect of the present invention, a method is provided for performing an APDE process in a memory cell having a substrate, a control gate and a floating gate formed over the substrate, and a source region and a drain region. The method includes applying a first voltage to the control gate and applying a second voltage to the source region, the second voltage being different than the first voltage.

According to yet another aspect of the invention, a memory device is provided including a plurality of memory cells arranged in a column. Each of the plurality of memory cells includes: a substrate, wherein a first portion of the substrate acts as a source region for the memory cell and a second portion of the substrate layer acts as a drain region for the memory cell; a first dielectric layer formed on the first conductive layer; and a stacked gate structure formed on the first dielectric layer, the stacked gate structure including a floating gate and a control gate separated by a second dielectric layer. Drain regions for each of the plurality of memory cells may be coupled together as a common bit line terminal. Source regions for each of the plurality of memory cells may be coupled together as a common source terminal. Control gates for each of the plurality of memory cells may be coupled together as a control gate terminal. Substrates for each of the plurality of memory cells may be coupled together as a common substrate terminal. A first resistive element may be coupled between the common source terminal and the control gate terminal. A second resistive element may be coupled between the first resistive element and a ground terminal.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the present invention provide non-volatile memory devices including circuitry for correcting an over-erased memory cell, such as flash electrically erasable read only memory (EEPROM) devices. The memory device may include a substrate. A control gate and a floating gate may be formed over the substrate. A source region and a drain region may be formed in the substrate. A node may be coupled to the control gate. A resistive element may be coupled between the source and the node. A source terminal may be coupled to the node, wherein the source terminal is configured to receive a source voltage $V_{SRC}$.

Figure 1A:
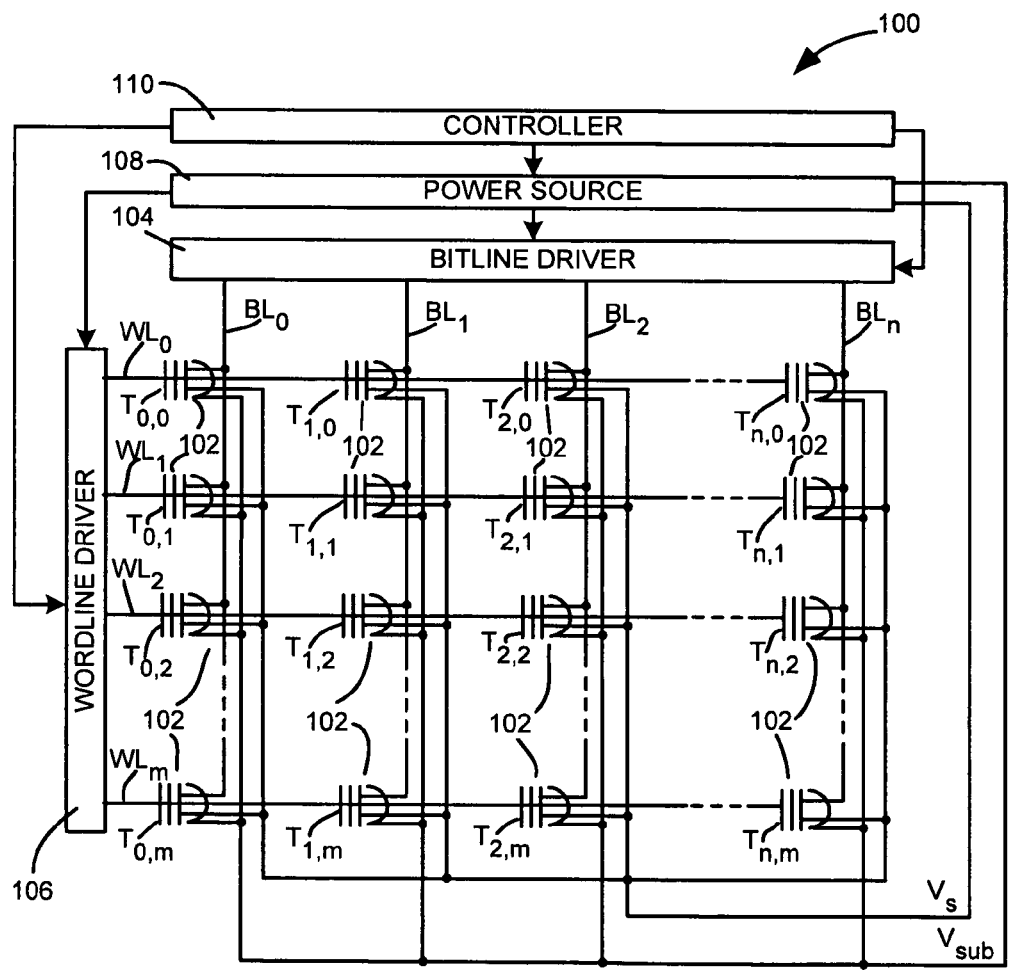
FIG. 1A is a simplified electrical schematic diagram of programmable flash EEPROM device.

FIG. 1A illustrates an exemplary configuration of a flash EEPROM 100 formed in accordance with an embodiment of the present invention. Flash memory 100 may include a plurality of memory cells 102, arranged in a rectangular matrix or array of rows and columns, a plurality of bit lines (BL) associated with each column, a plurality of word lines associated with each row, a bit line driver 104, a word line driver 106, a power source 108 and a controller 110.

Assuming that there are n columns and m rows, the bit lines may be designated as $BL_0$ to $BL_n$ and the word lines may be designated as $WL_0$ to $WL_m$. Accordingly, there may be n+1 bit lines and m+1 word lines. Bit line driver 104 applies appropriate voltages to the bit lines. Similarly, appropriate voltages are applied to the word lines by word line driver 106. The voltages applied to drivers 104 and 106 may be generated by a power source 108 under the control of a controller 110, which may include on-chip logic circuitry. The controller 110 may also control the drivers 104 and 106 to address the memory cells individually or collectively as will be described below.

A memory cell 102 is located at each junction of a word line and a bit line. Each cell 102 includes a Metal-Oxide-Semiconductor (MOS) Field Effect Transistor (FET) having a source and drain formed in a semiconductor substrate, a floating gate, and a control gate separated from the floating gate by a layer of oxide. Additional details regarding the formation of cell 102 will be described below in relation to FIG. 2. As should be appreciated, the cells of a flash EEPROM differ from conventional FETs in that they include the floating gate and tunnel oxide layer disposed between the control gate and the semiconductor substrate in which the source and drain are formed.

Cells 102 illustrated in FIG. 1A may be designated using the notation $T_{i,j}$, where j is the row (word line) number and i is the column (bit line) number. The control gates of cells 102 are connected to respective word lines, and the drains of cells 102 are connected to respective bit lines as illustrated. The sources of all of the cells are connected to the power source 106.

Figure 1B:
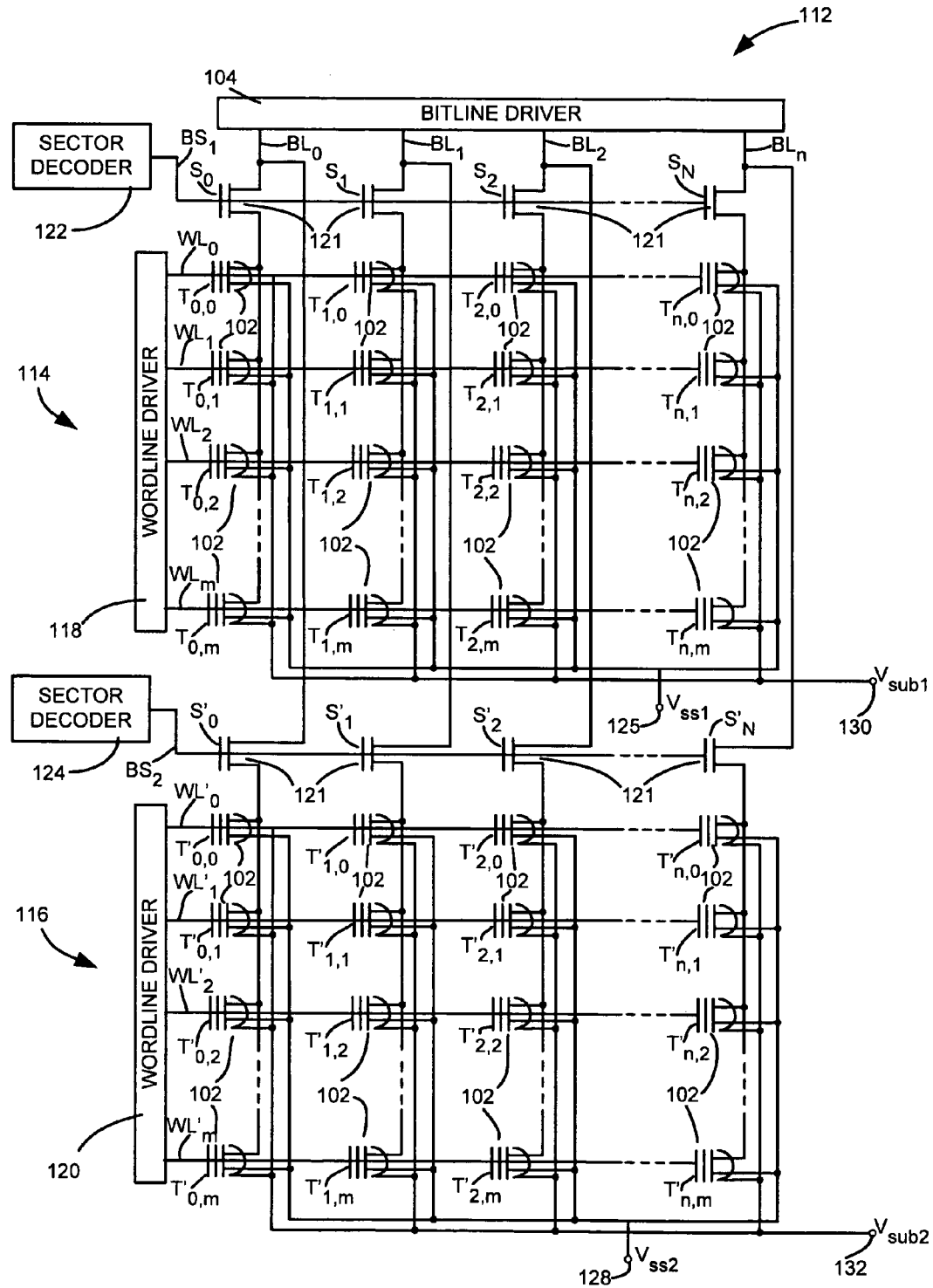
FIG. 1B illustrates a programmable flash EEPROM device having cells arranged in banks.

FIG. 1B illustrates another flash EEPROM 112 that is similar to memory 100 except that cells 102 are divided into banks, (also known as pages or sectors), two of which are shown in FIG. 1B, each of which can be programmed, erased, and read independently. Memory 112 includes a first cell bank or page 114 and a second cell bank or page 116. Memory cells 102 in the first bank 114 are designated in the same manner as in FIG. 1A, whereas a prime symbol is added to the designations of cells 102 in the second bank 116. Word lines of banks 114 and 116 are connected to separate word line drivers 118 and 120, respectively.

In addition to memory cells 102, each bank 114 and 116 includes a select or pass transistor 121 for each bit line. Select transistors 121 for the banks 114 and 116 are designated as $S_0$ to $S_N$ and $S'_0$ to $S'_N$, respectively. The drains of select transistors 121 are connected to respective bit lines, whereas the sources of select transistors 121 are connected to the drains of the transistors for the word lines $WL_0$ to $WL_m$ and $WL'_0$ to $WL'_m$.

Select transistors 121 differ from the memory cell transistors 102 in that they are conventional MOSFETs and therefore lack floating gates. Select transistors 121 are switching elements rather than memory elements. The gates of select transistors 121 for bank 114 are connected to a bank select BS, of a sector decoder 122 and the gates of select transistors 121 for the bank 116 are connected to a bank select output $BS_2$ of a sector decoder 124. The sources of the memory cells 102 in bank 114 may be connected to a common source supply voltage $V_{ss1}$ 125 and the sources of memory cells 102 in the bank 116 may be connected to a common source supply voltage $V_{ss2}$ 128. The p-wells (substrates) of memory cells 102 in bank 114 may be connected to a common substrate voltage $V_{sub1}$ 130 and the p-wells of memory cells 102 in bank 114 may be connected to a common substrate voltage $V_{sub2}$ 132.

Bank 114 may be selected by applying a logically high signal to bank select line BS, effectively turning on select transistors $S_0$ to $S_N$ 121 and connecting the bit lines $BL_0$ to $BL_n$ to the underlying memory cells 102. Bank 114 may be deselected by applying a logically low signal to the bank select line BS, that turns off select transistors $S_0$ to $S_N$ 121 and disconnects memory cells 102 from the bit lines. The bank 116 may be selected and deselected in an essentially similar manner using the bank select signal $BS_2$ and select transistors $S'_0$ to $S'_N$. The operation of memory 112 is essentially similar to that of memory 100 (FIG. 1A), except that the program, erase and read operations can be performed on the banks 114 and 116 independently or simultaneously.

Figure 2:
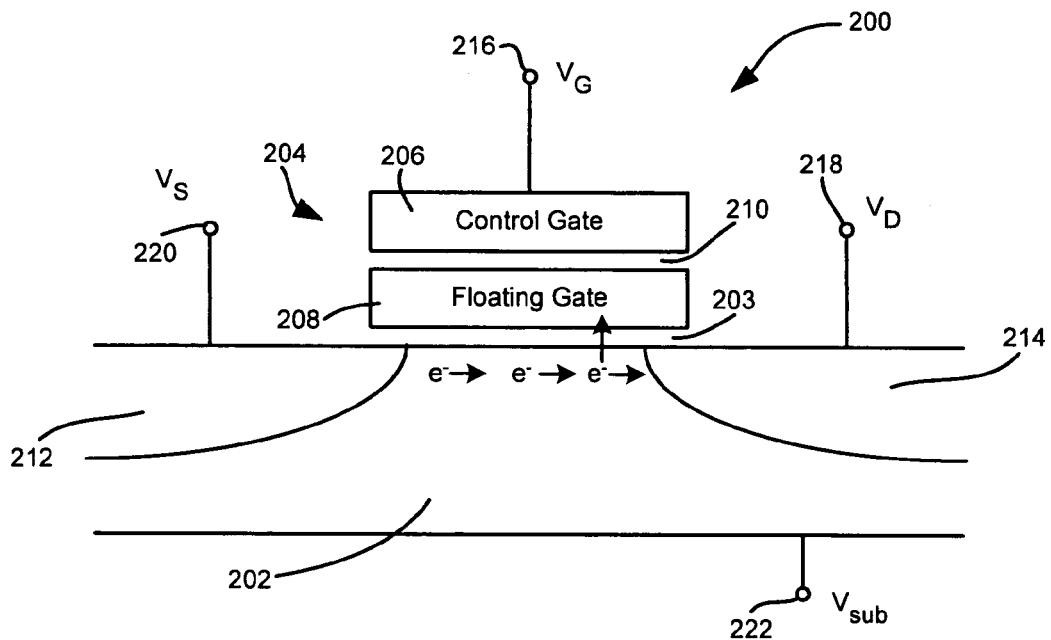
FIG. 2 is a schematic cross-section of an exemplary flash memory cell formed in accordance with an embodiment of the present invention.

FIG. 2 illustrates a schematic cross-section of an exemplary flash memory cell 200 formed in accordance with an embodiment of the present invention. Referring to FIG. 2, memory cell 200 may include a silicon substrate 202, an oxide layer 203 and a stacked gate structure 204 including a control gate 206 and a floating gate 208 separated by a dielectric layer 210.

In one embodiment, silicon substrate 202 may include a p-type substrate. In another embodiment, silicon substrate 202 may include an n-type substrate. Memory cell 200 may include a pair of doped regions 212 and 214 formed in silicon substrate 202. Doped regions 212 and 214 may include $n^+$ type doped regions for a p-type substrate 202. Doped region 212 may function as a source region and doped region 214 may function as a drain region for memory cell 200. Dielectric layer 210 may include silicon dioxide. In one implementation, oxide layer 203 may be referred to as a tunnel oxide layer.

When memory cell 200 is undergoing an APDE process in accordance with one implementation consistent with the present invention, a voltage $V_G$ may be applied to the control gate 206 via a terminal 216, a voltage $V_D$ may be applied to drain region 214 via the terminal 218, a voltage $V_S$ may be applied to source region 212 via terminal 220. In one exemplary implementation, all source regions have a common terminal such that the voltage $V_S$ is applied to the sources of all cells in the block. A voltage $V_{sub}$ may be applied to the substrate 202 via terminal 222. Similarly, it should also be remembered that all of the p-wells (substrates) have a common terminal so that the voltage $V_{sub}$ may be applied to the substrates of all of the cells.

Figure 3:
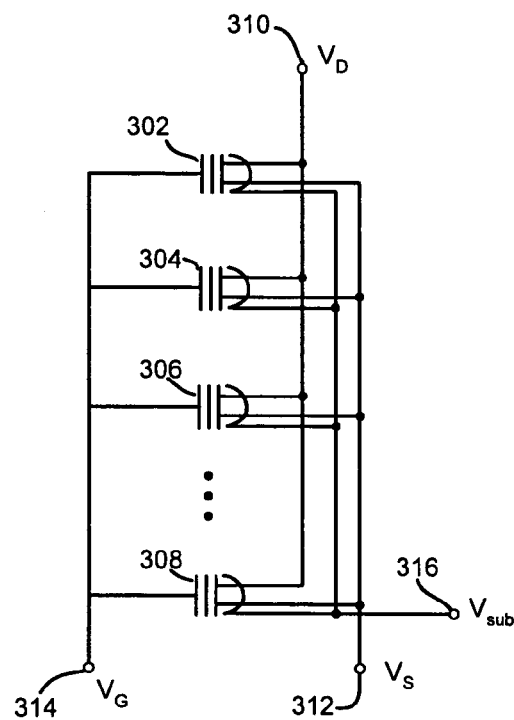
FIG. 3 is a simplified electrical schematic diagram of a column of flash memory cells showing automatic programming disturb erase (APDE) voltages applied to the cell terminals in accordance with one implementation of the present invention.

FIG. 3 is a simplified electrical schematic diagram of a column 300 of flash EEPROM cells 302, 304, 306 and 308 showing APDE voltages applied to the cell terminals in accordance with one implementation of the present invention. A bit line APDE voltage $V_D$ is applied to a drain terminal 310 and the sources of the cells are connected to the common source terminal 312 to which a voltage $V_S$ may be applied. In one implementation consistent with principles of the invention, source terminal 312 may be connected to a ground node. A control gate voltage $V_G$ may also be applied to word line terminal 314 of each cell in column 300. A voltage $V_{sub}$ may also be applied to a substrate terminal 316.

Figure 4:
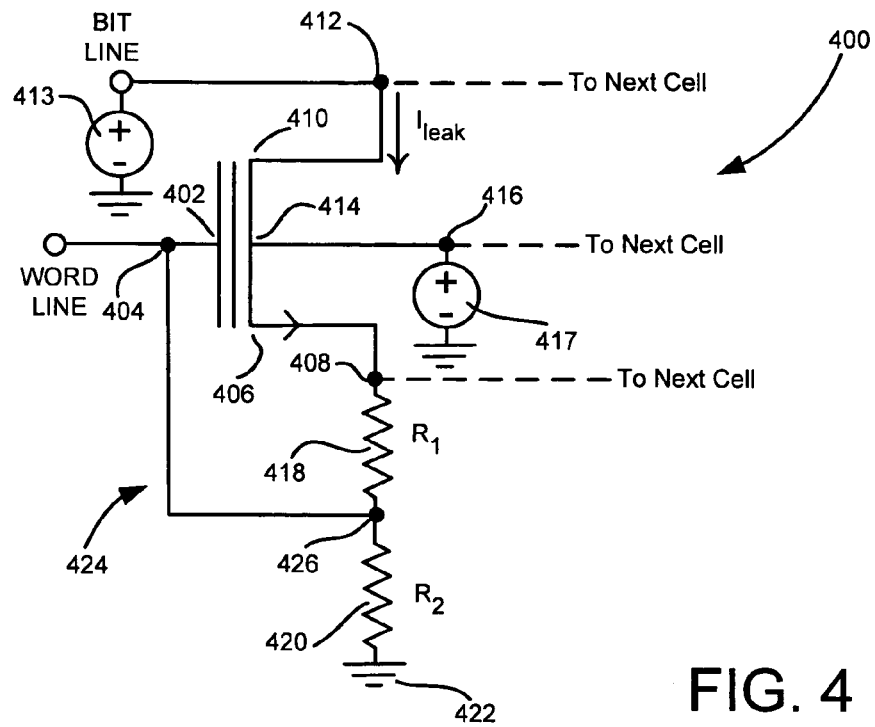
FIG. 4 is a simplified electrical schematic diagram illustrating one implementation of a flash memory cell configured in accordance with principles of the invention.

FIG. 4 is a simplified electrical schematic diagram illustrating a flash memory cell 400 configured in accordance with principles of the invention. Memory cell 400 may represent a single cell in an array of memory cells, such as an array similar to that illustrated in FIG. 1A. Memory cell 400 may include a control gate 402, a control gate terminal 404, a source 406, a source terminal 408, a drain 410, a drain terminal 412, a drain voltage source 413, a substrate 414, a substrate terminal 416, a substrate voltage source 417, a first resistor (R1) 418, a second resistor (R2) 420, and a ground terminal 422. As is understood in the art, a column of memory cells includes a plurality of memory cells 400 coupled in parallel, such that connections to each cell are identical throughout the column. Referring to FIGS. 1A and 3, controller 110 may select a column of flash memory cells 400 to be erase-corrected via an APDE operation. Each column of the flash memory device may be selected a column at a time until the whole flash memory device has been erase-corrected. Technology for implementing such a controller 110 is well within the skill of one of ordinary skill in the art of flash memory devices and will therefore not be described in detail herein.

Referring back to FIG. 4, one implementation of memory cell 400 may be biased via connection 424, which connects the source 406 and control gate terminal 404 of cell 400 at node 426. In such a configuration, source 406 is coupled to the control gate 402 in each flash memory cell 400, and the respective word line corresponding to each flash memory cell remains floating. According to one implementation, first resistor (R1) 418 may be coupled between source terminal 408 and node 426. Additionally, second resistor (R2) 420 may be coupled between node 426 and ground terminal 422 effectively in series with first resistor (R1) 418. By providing independent resistors R1 418 and R2 420 in the manner set forth above, voltages applied to each of the source 406 and control gate 402 may be differentiated. For example, a control gate voltage applied to the gate 402 may be adjusted by R2 alone, while a source bias voltage applied to source 406 may be adjusted by the combination of R1 and R2, resulting in independent values of $V_g$ and $V_S$ and further enabling fine tuning of the over-erase correction process.

As stated previously, the DIBL causes high column leakage for MOS devices with reduced gate length. The source bias voltage $V_S$ can help reduce the excessive APDE current contributed by high DIBL. Adjusting the gate voltage $V_g$ can optimize the trade-off between APDE speed and APDE current. In one exemplary implementation consistent with principles of the invention, each of the first and second resistors 418, 420 may have resistance values ranging from, for example, about 1 kΩ to about 50 kΩ according to an embodiment of the present invention. In one specific embodiment, first resistor 418 has a resistance value of about 6 kΩ and second resistor 420 has a resistance value of about 3 kΩ.

Further referring to FIG. 4, in one embodiment of the present invention, a bit line APDE voltage $V_D$ may be provided by drain voltage source 413 and applied to the drain terminal 412 corresponding to the selected column of flash memory cells 400. In one implementation consistent with the present invention, drain voltage source 413 applies a voltage ranging from, for example, about 4 volts to 6 volts to drain terminal 412 during the APDE process. In addition, substrate 414 may be coupled to a substrate voltage source 417 at substrate terminal 416. In one implementation consistent with the present invention, substrate voltage source 417 may apply a negative voltage ranging from, for example, about −3.0 volts to −0.5 volts to substrate terminal 416 during the APDE process.

With the above-described configuration, during the APDE process, sufficient charge carriers, such as electrons, are reinjected into the floating gate structure of each flash memory cell 400 of the selected column of flash memory cells after an erase process to restore the threshold voltage of the over-erased flash memory cells. Applying such voltage bias of the APDE process for a longer period of time (i.e., a higher APD time) ensures a higher average threshold voltage for the selected column of flash memory cells to minimize leakage current. A predetermined APD time may be used for each cycle in the APDE process such that an acceptably low level of leakage current flows through the column of flash memory cells. Variations in device parameters, such as gate length, are automatically adjusted for by the feedback configuration of the gate voltage $V_g$. In addition, APDE current and APDE time may be optimized by adjusting the values of R1 and R2, such that the desired result is achieved, while ensuring that the erasing cycle of the flash memory array remains at an acceptable level.

Application of the bias voltages described above is repeated for each column of the array of flash memory cells requiring over-erase correction. In one embodiment consistent with principles of the invention, application of the bias voltages is repeated for each column of the array of flash memory cells until the APDE process is performed for the whole array of flash memory cells requiring over-erase correction.

Figure 5:
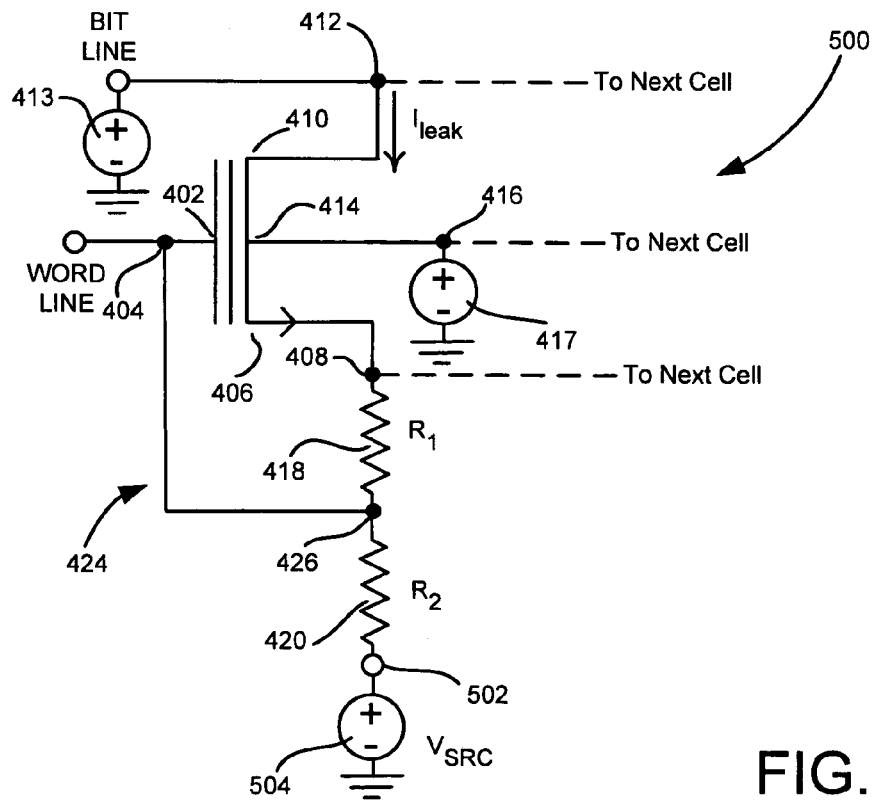
FIG. 5 is a simplified electrical schematic diagram illustrating a second implementation of a flash memory cell configured in accordance with principles of the invention.

FIG. 5 is simplified electrical schematic diagram illustrating another implementation of a flash memory cell 500, in accordance with principles of the invention. Similar to the embodiment discussed above with respect to FIG. 4, memory cell 500 may include a control gate 402, a control gate terminal 404, a source 406, a source terminal 408, a drain 410, a drain terminal 412, a drain voltage source 413, a substrate 414, a substrate terminal 416, a substrate voltage source 417, a first resistor (R1) 418, a second resistor (R2) 420. Memory cell 500 may also include a terminal 502, and a voltage source $V_{SRC}$ 504.

One implementation of memory cell 500 may connect the source 406 and control gate terminal 404 of cell 400 at node 426 via connection 424. In such a configuration, source 406 is again coupled to the control gate 402 in each flash memory cell 500, and the respective word line corresponding to each flash memory cell remains floating. According to one implementation, first resistor R1 418 may be coupled between source terminal 408 and node 426. Additionally, resistor R2 420 may be coupled between node 426 and terminal 502 in series with first resistor R1 418. Additionally, voltage source $V_{SRC}$ 504 provides a voltage at terminal 502 that is applied to the control gate 402 (through second resistor R2 420) and source 406 (through first and second resistors R1+R2 418, 420). By providing independent resistors R1 418 and R2 420 as well as an adjustable voltage source $V_{SRC}$, voltages applied to each of the source 406 and control gate 402 may be more accurately and quickly differentiated. For example, a control gate voltage applied to the gate 402 may be adjusted by R2 alone in combination with the voltage source $V_{SRC}$, while a source bias voltage applied to source 406 may be adjusted by the combination of R1 and R2 with voltage source $V_{SRC}$, resulting in independent values of $V_g$ and $V_S$ and further enabling fine tuning of the over-erase correction process. In addition, providing an independent voltage source $V_{SRC}$ enables more efficient meeting of the target voltage in correcting over-erased memory cells. Further, $V_S$ may be ramped up more quickly in this implementation using $V_{SRC}$. $V_{SRC}$ may also help reduce the load on the drain pump.

In one exemplary implementation consistent with principles of the invention, each of the resistor R1 418 and second resistors R2 420 may have resistance values ranging from, for example, about 1 kΩ to about 50 kΩ and $V_{SRC}$ may apply a voltage ranging from, for example, about 0.3 to 1.0 Volts according to an embodiment of the present invention. In one specific embodiment, resistor R1 418 has a resistance value of about 6 kΩ, resistor R2 420 has a resistance value of about 3 kΩ and $V_{SRC}$ applies a voltage of about 0.5 volts.

Figure 6:
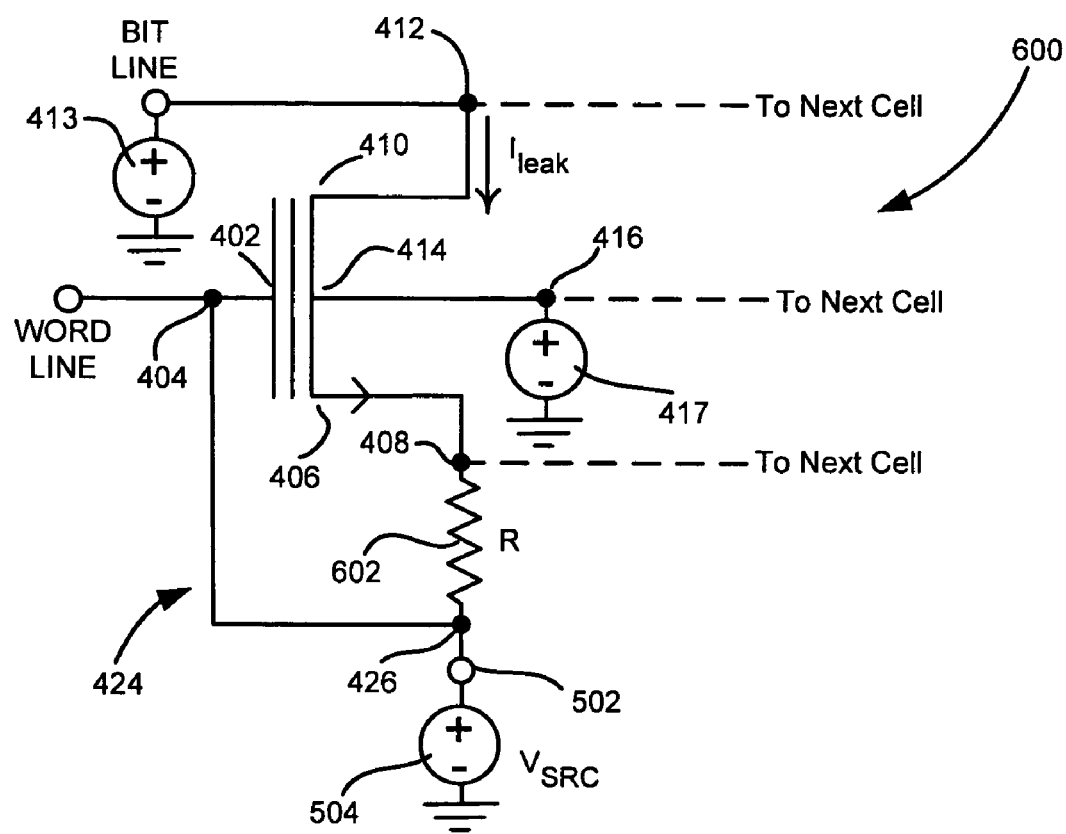
FIG. 6 is a simplified electrical schematic diagram illustrating a third implementation of a flash memory cell configured in accordance with principles of the invention.

FIG. 6 is simplified electrical schematic diagram illustrating yet another implementation of a flash memory cell 600, in accordance with principles of the invention. Similar to the embodiment discussed above with respect to FIGS. 4 and 5, memory cell 600 may include a control gate 402, a control gate terminal 404, a source 406, a source terminal 408, a drain 410, a drain terminal 412, a drain voltage source 413, a substrate 414, a substrate terminal 416, a substrate voltage source 417. Flash memory cell 600 may also include a source resistor R 602, a terminal 502, and a voltage source $V_{SRC}$ 504.

Memory cell 600 may include a connection 424 connecting the source 406 and control gate terminal 404 of cell 400 at node 426. According to one implementation, source resistor R 602 may be coupled between source terminal 408 and node 426. Additionally, voltage source $V_{SRC}$ 504 provides a voltage at terminal 502 that is applied to the control gate 402 and source 406 (through source resistor R 602). By providing a source resistor R 602 as well as an adjustable voltage source $V_{SRC}$, voltages applied to each of the source 406 and control gate 402 may be more accurately and quickly differentiated. For example, a control gate voltage applied to the gate 402 may be adjusted by the voltage source $V_{SRC}$, while a source bias voltage applied to source 406 may be adjusted by the combination of source resistor R with voltage source $V_{SRC}$, resulting in independent values of $V_g$ and $V_S$ and further enabling fine tuning of the over-erase correction process. In addition, as discussed above, providing an independent voltage source $V_{SRC}$ enables more efficient meeting of a target voltage in correcting over-erased memory cells.

In one exemplary implementation consistent with principles of the invention, source resistor 602 may have a resistance value ranging from, for example, about 1 kΩ to about 50 kΩ and $V_{SRC}$ may apply a voltage ranging from, for example, about 0.3 to 1.0 volts according to an embodiment of the present invention. In one specific embodiment, source resistor 602 has a resistance value of about 4 kΩ, and $V_{SRC}$ applies a voltage of about 0.7 volts. Similar to memory cell 600, $V_{SRC}$ 504 enables the voltage at source 406 to be ramped up more quickly, thereby reducing APDE time. $V_{SRC}$ 504 may also reduce the current load on the drain pump.

Implementations, consistent with principles of the invention allow for flexible and fine adjustment of APDE speed and APDE current. In addition, by adjusting the resistance values and voltage values, the invention may be optimized to adjust for different channel lengths and/or various APDE efficiency variations.

The foregoing is by way of example only and is not intended to be limiting. For example, the present invention may be practiced with any array flash memory cells. In addition, any specified material, any specified dimensions, and any specified voltage levels described herein are by way of example only. Other materials, dimensions, and voltage levels may be used for practicing the present invention, as would be apparent to one of ordinary skill in the art of non-volatile flash memory devices from the description herein.

In addition, no element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise. The scope of the invention is defined by the claims and their equivalents.

What is claimed is:

1. A memory device including circuitry for correcting an over-erased memory cell in the memory device, comprising:
    a substrate;
    a control gate and a floating gate formed over the substrate;
    a source region and a drain region;
    a first resistor coupled between the source region and a node,
    where the node is coupled to the control gate; and
    a second resistor coupled between the node and a ground terminal.

2. The memory device of claim 1, further comprising:
    a terminal coupled to the second resistor, the terminal to receive a voltage from a voltage source.

3. The memory device of claim 1, where the first resistor and the second resistor have resistance values ranging from about 1 kΩ to about 50 kΩ.

4. The memory device of claim 1, where:
    the first resistor has a resistance value of about 6 kΩ; and
    the second resistor has a resistance value of about 3 kΩ.

5. The memory device of claim 2, where the voltage source applies a voltage ranging from about 0.3 volts to about 1.0 volts.

6. The memory device of claim 5, where the voltage source applies a voltage of about 0.5 volts.

7. The memory device of claim 1, where the memory device includes a plurality of memory cells comprised of N-channel field effect transistors.

8. A memory device including circuitry for correcting an over-erased memory cell in the memory device, comprising:
    a substrate;
    a control gate and a floating gate formed over the substrate;
    a control gate terminal coupled to the control gate;
    a source region and a drain region;
    a source terminal coupled to the source region; and
    a first resistor coupled between the source terminal and a second terminal,
    where the second terminal is directly coupled to the control gate terminal, and where the second terminal is to directly receive a voltage from a voltage source, where the voltage applied to the second terminal is not applied to the first resistor before reaching the second terminal.

9. The memory device of claim 8, where the voltage source applies a voltage ranging from about 0.3 volts to about 1.0 volts.

10. The memory device of claim 9, where the voltage source applies a voltage of about 0.7 volts.

11. The memory device of claim 8, where the first resistor has a resistance value of about 4 kΩ.

12. A method for performing an automatic program disturb after erase (APDE) process for correcting an over-erased memory cell having a substrate, a control gate and a floating gate formed over the substrate, and a source region and a drain region, comprising:
   applying a first voltage to the control gate;
   applying a second voltage to the source region, the second voltage being different than the first voltage;
   coupling a first resistor between the source region and the control gate; and
   coupling a second resistor between the first resistor and a ground terminal.

13. The method of claim 12, where:
   the first resistor has a resistance value of about 6 kΩ; and
   the second resistor has a resistance value of about 3 kΩ.

14. A method for performing an automatic program disturb after erase (APDE) process for correcting an over-erased memory cell having a substrate, a control gate and a floating gate formed over the substrate, and a source region and a drain region, comprising:
   applying a first voltage to the control gate;
   applying a second voltage to the source region, the second voltage being different than the first voltage;
   coupling a first resistor between the source region and the control gate; and
   coupling a second resistor between the first resistor and a terminal, the terminal to receive a voltage from a voltage source.

15. A method for performing an automatic program disturb after erase (APDE) process for correcting an over-erased memory cell having a substrate, a control gate and a floating gate formed over the substrate, and a source region and a drain region, comprising:
   applying a first voltage to the control gate;
   applying a second voltage to the source region, the second voltage being different than the first voltage;
   coupling a first resistor between the source region and a terminal; and
   coupling the terminal to the control gate, the terminal to receive a voltage from a voltage source, where the voltage applied to the terminal is not applied to the first resistor before reaching the terminal.

16. The method of claim 15, where the voltage source applies a voltage ranging from about 0.3 volts to about 1.0 volts.

17. A memory device, comprising:
   a plurality of memory cells arranged in a column;
   each of the plurality of memory cells comprising:
      a substrate, where a first portion of the substrate acts as a source region for the memory cell and a second portion of the substrate acts as a drain region for the memory cell;
      a first dielectric layer formed on the substrate; and
      a stacked gate structure formed on the first dielectric layer, the stacked gate structure including a floating gate and a control gate separated by a second dielectric layer,
   where drain region for each of the plurality of memory cells is coupled to a common bit line terminal,
   where source region for each of the plurality of memory cells is coupled to a common source terminal,
   where the control gate for each of the plurality of memory cells is coupled to a control gate terminal,
   where the substrate for each of the plurality of memory cells is coupled to a common substrate terminal;
   a first resistor coupled between the common source terminal and the control gate terminal; and
   a second resistor coupled between the first resistor and a ground terminal.

18. The memory device of claim 17, where:
the first resistor has a resistance value of about 6 kΩ; and
the second resistor has a resistance value of about 3 kΩ.

* * * * *